United States Patent [19]

Dearnaley et al.

[11] Patent Number: 4,831,271
[45] Date of Patent: May 16, 1989

[54] ION BEAM DOSIMETRY

[75] Inventors: Geoffrey Dearnaley; Antony E. Hughes, both of Oxfordshire; Steven Rosenbaum, London, all of England

[73] Assignee: Millspin Limited, London, England

[21] Appl. No.: 80,811

[22] Filed: Aug. 3, 1987

[30] Foreign Application Priority Data

Aug. 14, 1986 [GB] United Kingdom ............... 8619775

[51] Int. Cl.$^4$ ..................... A21K 27/02; G01N 5/00
[52] U.S. Cl. ........................ 250/492.2; 250/474.1
[58] Field of Search ............ 250/474.1, 492.21, 397, 250/398

[56] References Cited

U.S. PATENT DOCUMENTS 2,664,511 12/1953 Moos ............................... 250/474.1
4,570,070 2/1986 Tabei ............................. 250/492.21

OTHER PUBLICATIONS

Wada et al., "Silicon Planar Devices Using Nitrogen Ion Implantation", Jap. Jour. of Appl. Physics, vol. 15, No. 9, Sep. 1976, pp. 1725–1730.

Primary Examiner—Janice A. Howell
Attorney, Agent, or Firm—Wolf, Greenfield & Sacks

[57] ABSTRACT

A work piece 13 is implanted with N$^+$ ions from a source 1 to improve its surface hardness. The dosage of implanted ions is monitored by a member 14 which changes its color in dependence upon the dose. The member 14 may comprise a tantalum plate 15 with an anodic oxide layer 16 of a thickness to produce interference colors. In accordance with the invention this layer 16 changes colors as a function of the ion dosage.

23 Claims, 1 Drawing Sheet

ION BEAM DOSIMETRY DESCRIPTION

1. FIELD OF THE INVENTION

This invention relates to ion beam dosimetry and has particular but not exclusive application to monitoring dosage of nitrogen ion beams used for modifying characteristics of materials.

2. BACKGROUND TO THE INVENTION

In addition to its use in the semiconductor device field, ion implantation has been developed as a technique for modifying the surface properties of materials. Treating the surface of metals in this way can significantly reduce wear and high temperature oxidisation. A general review of this subject is given in Physics Technology Volume 14, 1983 pp 225-232 G. Dearnaley. Much of the research in this field has utilised a nitrogen ion source which has been used to treat materials such as steels, titanium alloys, cemented carbides and ceramics so as to strengthen their surfaces and provide improved wear resistance. The process is carried out in a vacuum using a beam of electrically accelerated ions, typically at energies of 50-150 kev. During this treatment, it is necessary to monitor the number of ions that impinge per unit area (called the dose) and to terminate the process when an optimum dose has been applied. In ferritic steels, it is general practice to implant a dose of between $2.10^{17}$ and $4.10^{17}$ nitrogen atoms per $cm^2$, while in cement carbide, the preferred dose is somewhat lower, and in titanium alloys, it may be preferred to use a higher dose of for example $3.10^{17}$ to $7.10^{17}$ ions per $cm^2$.

In the past, the ion dose has been monitored electrically as an ion current incident upon the workpiece being treated. This has been achieved by an instrument that integrates the current as a function of time, called a current integrator. Alternatively, the beam current density has been monitored calorimetrically by its heating effect in some suitably insulated plate or block. Both of these prior methods have disadvantages. In particular, secondary electron emission from the workpiece surface can interfere with the ion current measurement technique while the calorimeter may intercept too large an area of the available beam thus interfering with the treatment of the workpiece provided by the beam. The present invention seeks to provide a much simpler and cheaper means of monitoring ion dosage.

SUMMARY OF THE INVENTION

According to the invention there is provided a method of monitoring an ion dose with a member which provides a visual indication of ion dosage applied thereto.

The invention also provides a member for monitoring ion dosage in an ion implantation process, said member providing a visual indication of the amount of ions applied thereto.

Preferably said visual indication comprises a colour change.

Preferably, but not necessarily, the visual indication is provided directly rather than as a latent image, so no subsequent processing may be necessary to obtain the visual indication. The invention has particular application to monitoring nitrogen ion dosage but also may be used with advantage for other implanted ions and may be used in monitoring ion dosage for semiconductor device fabrication techniques.

In accordance with the invention, it has been found that certain oxide materials undergo colour change in response to ion implantation, the change in colour being a function of the dosage. Oxide materials are available in various forms such as powders, crystals, deposited films or anodic oxide layers. Of these, a most convenient form has been found to be an anodic oxide layer produced on a plate or a foil of pure metal by application of a suitable voltage in an electrolyte solution.

Surface layers other than oxides may also be utilised.

It has been found according to the invention that anodic oxide layers formed on titanium and particularly tantalum are suitable. However, other reactive metals may be utilised, for example halfium, zirconium, niobium and thorium.

It is desirable that the colour changes should not be significantly influenced by the temperature at which the ion implantation occurs because this will depend upon the current density rather than the ion dose delivered. It has been shown that by a suitable choice of material and its method of preparation a colour change sufficiently independent of the implantation temperature can be achieved. Experiments have shown that a number of metal oxides undergo colour changes during nitrogen ion bombardment but some are too sensitive to be useful in the dose range required and certain others are not sensitive enough. The oxides of titanium ($TiO_2$) and tantalum ($Ta_2O_5$) provide an appropriate sensitivity. However, titanium oxide whether in the form of a powder or as an anodic film, displays colour changes that for some applications are too dependent upon implantation temperature.

Tantalum oxide, in powder form, is not particularly sensitive to nitrogen ion bombardment, but when produced as an anodic oxide film, of thickness sufficient to display optical interference colours (typically 50-1000 nm) this oxide is especially suitable for use as a dosimeter. The colour changes are generally vivid and substantially independent of implantation temperature up to about 500° C.

BRIEF DESCRIPTION OF THE DRAWINGS

In order that the invention may be more fully understood and carried into effect, an embodiment thereof will now be described by way of illustrative example with reference to the accompanying drawings in which.

DETAILED DESCRIPTION

Figure 1:
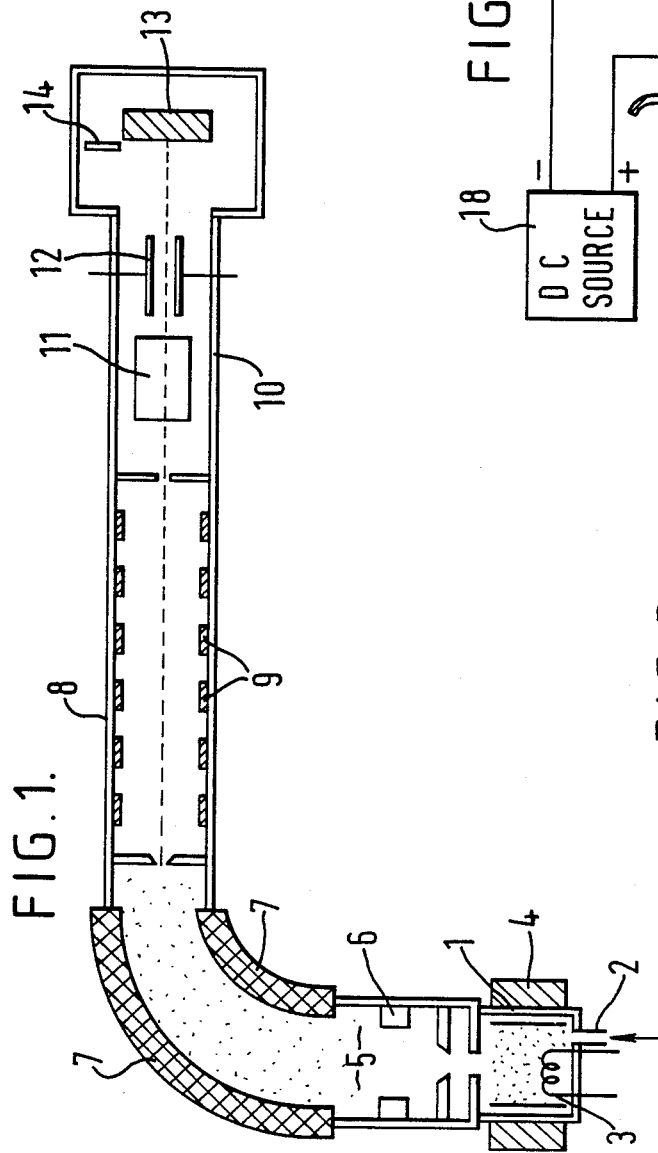
FIG. 1 is a schematic sectional view of ion implantation apparatus, utilising a dosimeter according to the invention.

Referring to FIG. 1, this shows a conventional ion implantation apparatus which may be used to implant nitrogen ions into a workpiece.

Gaseous nitrogen is introduced into chamber 1 through opening 2 and is ionised by a heater arrangement 3 and coils 4. The resulting nitrogen ions are drawn into space 5 by means of an electric field established by electrodes 6. Magnet coils 7 deflect appropriate ions into an accelerator 8 having a series of acceleration electrodes 9, in order to feed them to a targeting region 10 which includes deflection electrode pairs 11, 12. The resulting nitrogen ion stream is scanned by the electrodes 11, 12 across a workpiece 13. The entire apparatus operates in a vacuum as is well known in the art.

The nitrogen ions are embedded in the surface of the workpiece 13 and typically produce a very substantial improvement in surface hardness. However, other surface effects can be produced as discussed in the paper referred to hereinbefore.

Figure 3:
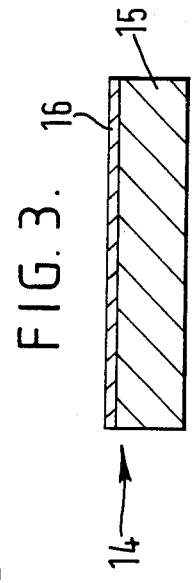
FIG. 3 is a sectional view of the dosimeter.

In order to monitor the dosage of nitrogen ions, a dosimeter 14 according to the invention is situated close to the workpiece 13. The dosimeter 14 is shown in section in FIG. 3 and consists of a tantalum plate 15, typically 1 cm$^2$ formed with a surface oxide layer 16. The layer 16 is conveniently produced by an anodisation process and typically has a thickness in the range of 50–1000 nm.

In accordance with the invention, it has been found that the colour of the anodised layer 16 changes in dependence upon the dosage of nitrogen ions applied thereto. In experiments carried out using nitrogen ion energies ranging from 50–100 kev, it was shown that the colour change can be correlated directly with the implanted nitrogen dose. For this purpose, ions of the isotope $^{15}$N were implanted by means of the apparatus shown in FIG. 1 and the implanted dose was determined by using nuclear reaction analysis (NRA) in which protons of 1.1 Mev energy were used to induce the $^{15}$N(p,$\alpha$) nuclear reaction within the implanted layer. The alpha particle yield could be related to that from a standard containing a known quantity $^{15}$N in order to determine the implanted dose accurately (to about ±10%).

The colour changes produced by different dosages depend upon the initial colour of the anodic oxide 16, which in turn is a function of its thickness. Tests made using various starting colours have suggested that a preferred starting colour is the second order dark purple, which undergoes a series of transitions through red-purple at about $10^{17}$N+ per cm$^2$ to a turquoise-grey at about $3.10^{17}$N+ per cm$^2$ and finally to a gold colour at about $7.10^{17}$N+ per cm$^2$.

Figure 2:
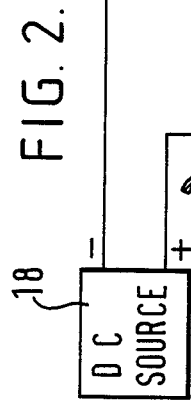
FIG. 2 illustrates apparatus for providing an anodised oxide layer on the dosimeter.

As shown in FIG. 2, the plate 15 can be anodised in a suitable electrolyte e.g. 15% solution of ammonium sulphate 17. The plate 15 is connected to a dc voltage source 18, which is typically a variable source having a voltage range of 0 to 230 volts. The voltage is increased in order to lay down the layer 16 as uniform anodic film, the thickness of the film being a function of the applied voltage. In the case of tantalum, a voltage in the range of 95 to 105 volts produces the most sensitive thickness for use in nitrogen ion implantation i.e. to produce the starting colour of second order dark purple discussed above.

Thus, in use, after a workpiece 13 has been dosed in the apparatus shown in FIG. 1, the dosimeter 14 may be removed together with the workpiece and its colour checked in order to ensure that an appropriate dosage has been produced by the apparatus. In this regard, the scanning electrodes 11, 12 are arranged to scan the nitrogen beam over both the workpiece and the dosimeter. Also, as is known in the art (but not shown) the workpiece 13 may be moved during the ion implantation process in order to achieve appropriate coverage.

After use, the dosimeter 14 may be acid etched to remove the layer 16 and then reanodised for subsequent use.

The colour changes produced on the dosimeter 14 can be measured more quantitatively, if required, by the use of commercially available equipment designed for standard colour monitoring. This is done by measurement of the optical reflectance as a function of photon energy and the internationally recognised colour parameters measured under standardised conditions can be plotted. The colour parameter L has been shown to vary linearly with the logarithm of the implanted nitrogen dose in anodised tantalum oxide, and so this produces the basis for instrumented dosimetry to supplement subjective visual methods e.g. for colour-blind operators.

Many modifications and variations of the invention will be apparent to those skilled in the art. Thus, whilst the invention has been described in relation to an anodised oxide layer on a tantalum substrate, other materials may be used e.g. titanium or other reactive metals. Also, the layer need not necessarily be an oxide layer. The dosimeter 14 can also be used in methods other than nitrogen ion implantation e.g. beam mixing. Furthermore, the invention has application to ion sources other than nitrogen e.g. ytterium and boron. Furthermore, the invention has application to monitoring ion implantation dosage for semiconductor device fabrication wherein impurity dopants are accelerated and implanted into semiconductor substrates.

In addition, the anodised oxide layer may be transferred from a metal plate onto a flexible carrier, e.g. a plastics material, which can be applied as a flexible tape to the workpiece.

Further the dosimeter 14 can be made in shapes other than a square plate, e.g. an L-shaped member to provide an indication of dosage in othorgonal directions.

We claim:

1. A method of monitoring the ion dosage received at a selected location from an ion beam comprising the steps of:
   mounting at said location a member which member itself undergoes a predetermined visually perceptible change in appearance in response to receiving an ion dosage;
   causing said beam to impinge on said member; and
   determining the ion dosage from the beam at the location from the visual change in appearance of the member.

2. A method according to claim 1 wherein said visual change comprises a colour change.

3. A method according to claim 2 wherein said member includes an oxide which undergoes a colour change in dependence upon ion dosage.

4. A method according to claim 3 wherein said oxide comprises a metallic, anodic oxide layer.

5. A method according to claim 4 wherein said layer has a thickness in the range of 50–1000 nm.

6. A method according to claim 4, wherein the anodic layer is provided on a flexible carrier of plastics material.

7. A method according to claim 4, wherein said anodic layer is formed on a metallic substrate.

8. A method according to claim 7 wherein said metallic substrate comprises a metal plate.

9. A method according to claim 8 wherein said metal plate has transversely disposed surfaces for monitoring ion dosages in different directions.

10. A method according to claim 7 wherein said substrate comprises a flexible metal foil.

11. A method according to claim 7 wherein the substrate is of tantalum, the electrolyte comprises ammonium sulphate, and said potential difference is in the range of 95–105 volts.

12. A method according to claim 7, wherein said metallic substrate is selected from titanium, tantalaum, halfium, zirconium, mobium and thorium.

13. A method according to claim 2 wherein said determining step includes the step of quantitatively measuring said change in color.

14. A method according to claim 1 wherein said determining step includes the step of visually observing the appearance of the member after said beam has impinged thereon.

15. An ion beam dosimeter which undergoes a predetermined color change in response to receiving an ion beam dosage comprising:
   a substrate; and
   a metallic, anodic oxide layer formed on said substrate, said oxide layer undergoing a color change in dependence upon ion dosage.

16. A dosimeter according to claim 15 wherein said layer has a thickness in the range of 50–1000 nm.

17. A dosimeter according to claim 15 wherein said substrate is flexible carrier of plastics material.

18. A dosimeter according to claim 15 wherein said substrate is a metallic substrate.

19. A method according to claim 1 wherein the ion beam is being utilized to apply an ion dose to an article; and
   wherein said causing step includes scanning ions from the beam over the article and the member.

20. A dosimeter according to claim 19 wherein said metal plate has transversely disposed surfaces for monitoring ion dosages in different directions.

21. A dosimeter according to claim 18 wherein said metallic substrate is selected from titanium, tantalum, halfium, zirconium, mobium and thorium.

22. A dosimeter according to claim 18 wherein said metallic substrate is of tantalum; and
   wherein said layer is formed with a thickness to provide a starting color of second order dark purple and which undergoes a transition through red purple with an ion dosage of $10^{17} N^+$ per $cm^2$.

23. A dosimeter according to claim 15 wherein said substrate comprises a flexible metal foil.

* * * * *